United States Patent [19]

Siligoni et al.

[11] Patent Number: 4,647,839
[45] Date of Patent: Mar. 3, 1987

[54] HIGH PRECISION VOLTAGE-TO-CURRENT CONVERTER, PARTICULARLY FOR LOW SUPPLY VOLTAGES

[75] Inventors: Marco Siligoni, Vittuone; Pietro Consiglio, Milan, both of Italy

[73] Assignee: SGS- ATES Componenti Elettronici S.p.A., Catania, Italy

[21] Appl. No.: 578,035

[22] Filed: Feb. 8, 1984

[30] Foreign Application Priority Data

Mar. 23, 1983 [IT] Italy ............................... 20220 A/83

[51] Int. Cl.$^4$ ............................ H03F 3/26; H03F 3/45
[52] U.S. Cl. ..................................... 323/312; 330/252
[58] Field of Search ............... 323/312, 314, 315, 316, 323/313; 330/252, 257, 261

[56] References Cited

U.S. PATENT DOCUMENTS

| | | | |
|---|---|---|---|
| 4,390,848 | 6/1983 | Blauschild | 330/252 |
| 4,410,858 | 10/1983 | Kusakabe | 330/257 |
| 4,456,887 | 6/1984 | Tokumo | 330/252 |
| 4,464,632 | 8/1984 | Yoshihisa et al. | 330/257 |
| 4,490,685 | 12/1984 | Sano | 330/252 |

FOREIGN PATENT DOCUMENTS 2420158 11/1974 Fed. Rep. of Germany ...... 330/252

OTHER PUBLICATIONS

Hellwarth, "Electrical Amplifier with Input Bias Network", IBM Tech. Disclosure Bulletin, v14, No. 3, Aug. 71, p. 966.
Hellwarth et al., "Ultrahigh Resistance Current Source . . . ", IBM Tech. Disclosure Bulletin, v16, No. 7, Dec. 73, pp. 2092–2093.

*Primary Examiner*—Patrick R. Salce
*Assistant Examiner*—D. L. Rebsch
*Attorney, Agent, or Firm*—Cushman, Darby & Cushman

[57] ABSTRACT

The common terminals of the two opposite transistors of a differential stage with an input signal represented by the voltage applied between the bases of the two transistors are connected to ground through two further transistors controlled by the current which passes through the above-mentioned transistors. The output signal is represented by the current which passes through one of said further transistors.

6 Claims, 4 Drawing Figures

HIGH PRECISION VOLTAGE-TO-CURRENT CONVERTER, PARTICULARLY FOR LOW SUPPLY VOLTAGES

BACKGROUND OF THE INVENTION

The present invention relates to a high precision voltage-to-current converter, particularly for low supply voltages.

The electronic arts include different fields in which it is necessary to operate with low supply voltages. One of these is the telephonic field, wherein the lower the voltage, the greater the line length with which a circuit can operate.

For such uses it is obviously necessary to have circuits specifically suitable for low voltages.

The present invention is specifically concerned with voltage-to-current converters, which in the prior art were not able to provide the utmost precision for low supply voltages. In particular, there exists a prior art converter which is based on the use of a differential stage with two oppositely arranged transistors with a coupling resistance among the common emitter terminals, wherein the input signal is constituted by a voltage applied between the two bases of the transistors and the output signal is constituted by the current which passes through one of said transistors. The precision of this known converter is poor, primarily because the conversion ratio depends on the sum of non-homogeneous resistances, such as the coupling resistance (of the static kind) on the one hand, and the inner resistances of the two transistors (of the dynamic kind) on the other hand. Any changes of the supply current of the two transistors, comprising corresponding changes of the inner resistances of the same transistors, in turn negatively influence the precision of the conversion ratio.

SUMMARY OF THE INVENTION

The object of the present invention is to realize a voltage-to-current converter, particularly for low supply voltages, which modifies the circuit configuration of the above-mentioned known converter so as to considerably increase its precision.

According to the invention such object is achieved by means of a voltage-to-current converter, comprising a differential stage with two opposite transistors with an input signal represented by the voltage applied between the bases of said transistors and with a coupling resistance interposed between the common emitter terminals of the same transistors, also comprising two further transistors interposed between said common emitter terminals and ground and controlled by the current which passes through said opposite transistors, the output signal being represented by the current which passes through one of said further transistors.

The two added transistors quickly influence the conversion ratio, thus increasing the precision. Specifically, their effect is to reduce, by factors equal to the the gains of the two added transistors, the contribution of the inner resistances of the two opposite transistors of the differential stage to the resistances which make up the denominator of the conversion ratio. Possible errors due to non-homogeneity of the resistances and to changes of the supply current are thus avoided or, in any case, very reduced.

BRIEF DESCRIPTION OF THE DRAWINGS

The features of the present invention will be better comprehended by making reference, by way of example, to the enclosed drawings, in which.

DETAILED DESCRIPTION OF THE PREFERRED EMBODIMENTS

Figure 1:
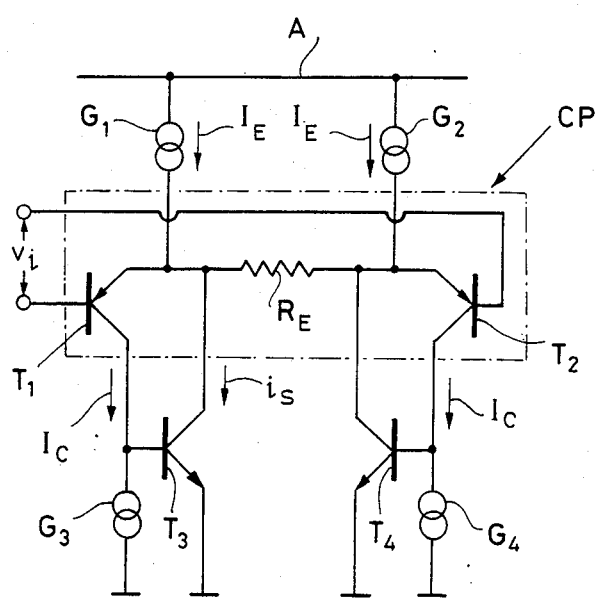
FIG. 1 shows the basic circuit diagram of a voltage-to-current converter according to the invention.

With reference to FIG. 1, there is illustrated a voltage-to-current converter according to the invention, which comprises a differential stage CP formed by two PNP transistors $T_1$ and $T_2$ disposed in opposition with the respective emitters connected to each other through a coupling resistance $R_E$ and also connected to a supply line A through respective current generators $G_1$ and $G_2$ (which can be substituted with resistances of suitable value), which generate a current $I_E$. Between the bases of the two transistors $T_1$ and $T_2$ there is applied a voltage $v_i$, which constitutes the input signal of the converter. The collectors of the above-mentioned transistors in turn are connected to ground through current generators $G_3$ and $G_4$ (these also can be substituted with resistances of suitable value), which generate a current $I_C$. The emitters of the transistors $T_1$ and $T_2$ are finally connected to ground through respective NPN transistors $T_3$ and $T_4$, whose bases are connected to the collectors of the transistors $T_1$ and $T_2$. The current $i_s = I_E - I_C$ which passes through one of the transistors $T_3$ and $T_4$ constitutes the standby current on which the output signal of the converter is superimposed.

As can be easily verified with mathematic calculation, the output current $i_s$ of the converter of FIG. 1 is given by the following relation:

$$i_s = \frac{V_i}{R_E + \frac{r_{e1}}{\beta_3} + \frac{r_{e2}}{\beta_4}}$$

where $r_{e1}$ and $r_{e2}$ are the inner resistances of the transistors $T_1$ and $T_2$ and $\beta_3$ and $\beta_4$ are the gains of the transistors $T_3$ and $T_4$.

From the above-mentioned relation it is evident that the effects of $r_{e1}$ and $r_{e2}$ on the conversion ratio is minimized by the factors $\beta_3$ and $\beta_4$ with consequent elimination of any possible inexactness due to the non-homogeneity of such dynamic resistances with the static resistance $R_E$ and due to the influence exerted on them by a possible change of $I_E$ and $I_C$. The conversion ratio substantially depends on $R_E$, which is a static resistance: it which does not change with the work condition. The converter of FIG. 1 therefore displays great precision.

Figure 2:
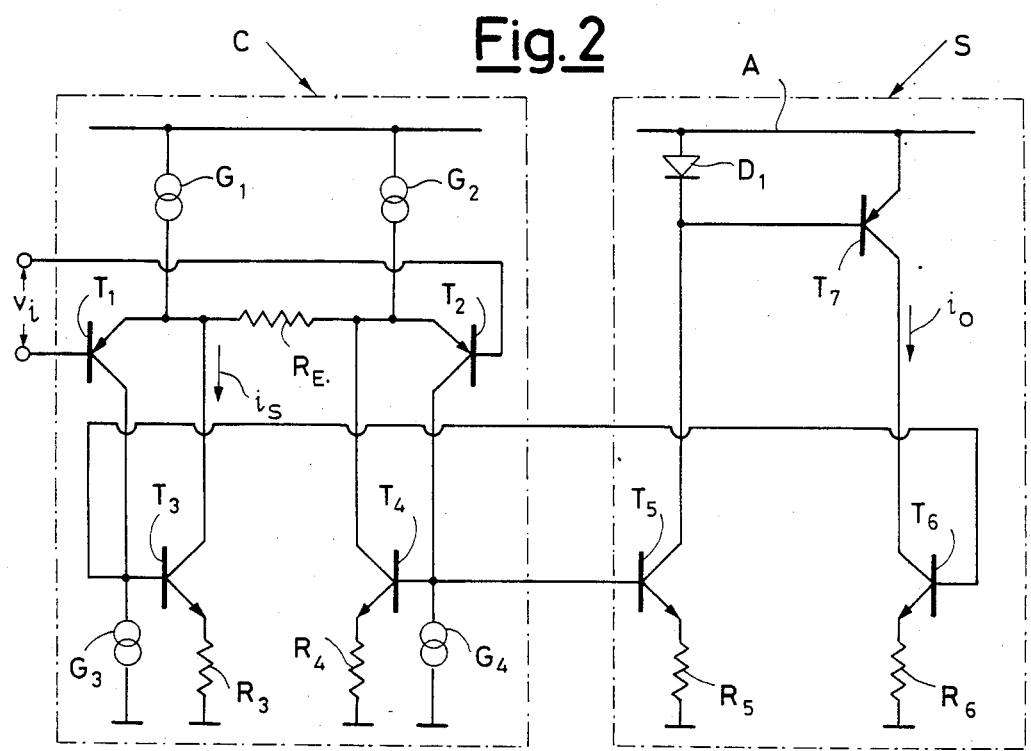
FIGS. 2-4 show different examples of use of said converter.

FIG. 2 illustrates how a mirror S can be associated with a voltage-to-current converter such as that shown in FIG. 1, here indicated by C, for the formation of a current amplifier. The converter C is equivalent to that of FIG. 1 with only the addition of two resistances $R_3$ and $R_4$ on the emitter of the transistors $T_3$ and $T_4$ (which are not essential for operation), while the mirror S comprises two NPN transistors $T_5$ and $T_6$ with the bases respectively connected to the bases of the transistors $T_4$ and $T_3$, the emitters connected to ground through resistances $R_5$ and $R_6$ and the collectors connected to the supply line A through a diode $D_1$ and, respectively, through a PNP transistor $T_7$ with the base connected to the collector of the transistor $T_5$. The collector current of the transistor $T_6$ constitutes the output signal of the current amplifier and is $i_o = ni_s$, where n is a constant depending on the features of the mirror S.

Figure 3:
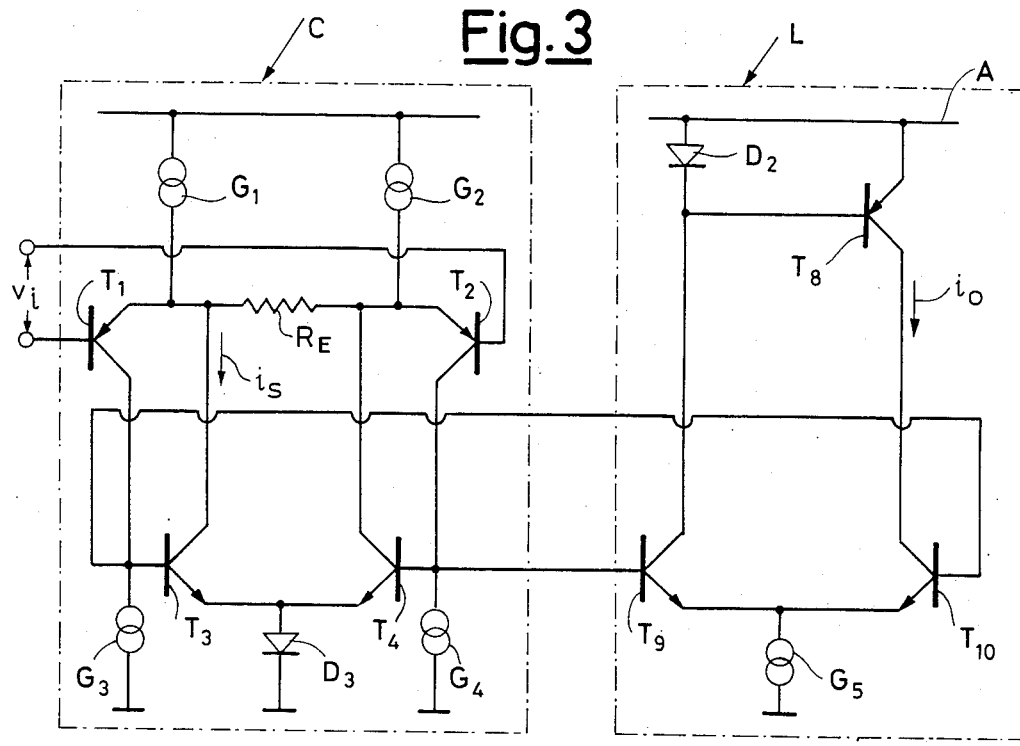

FIG. 3 shows how a linearization circuit can be associated with a voltage-to-current converter such as that depicted in FIG. 1, still indicated by C, for the formation of a signal multiplier. The converter C is equivalent to that of FIG. 1 with only the addition of a diode $D_3$ between the emitters of the transistors $T_3$ and $T_4$ and ground, with diode $D_3$ serving only as a bias for current generator $G_5$. The linearization circuit L is in turn formed by two NPN transistors $T_9$ and $T_{10}$, which have their emitters connected to ground through a current generator $G_5$, their bases respectively connected to the bases of the transistors $T_4$ and $T_3$ and their collectors connected to the supply line A through a diode $D_2$ and, respectively, through a PNP transistor $T_8$, with the base of transistor $T_8$ connected to the collector of the transistor $T_9$. The collector current of the transistor $T_{10}$ constitutes the output signal $i_o$ of the multiplier.

Figure 4:
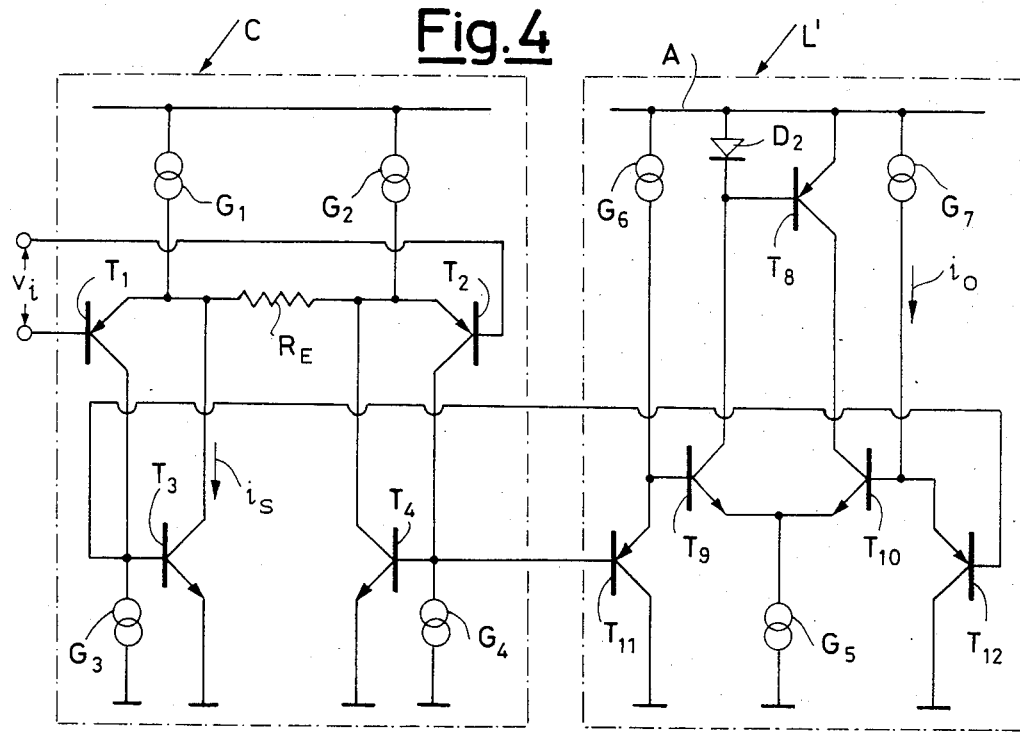

Finally, FIG. 4 shows the combination of a voltage-to-current converter C such as that shown in FIG. 1 and of a linearization circuit L', which is slightly modified with respect to the circuit L of FIG. 3, for the formation of a multiplier suitable for operation with a particularly low supply line voltage A. The differences in FIG. 4 with respect to FIG. 3 are that the diode $D_3$ is absent from the converter C, and two PNP transistors $T_{11}$ and $T_{12}$ are inserted in the linearization circuit L'. The transistors $T_{11}$ and $T_{12}$ have their collectors connected to ground, their bases respectively connected to the bases of the transistors $T_4$ and $T_3$ and their emitters connected to the bases of the transistors $T_9$ and $T_{10}$ and, through current generators $G_6$ and $G_7$, to the line A.

We claim:

1. A high precision voltage-to-current converter, particularly for low supply voltages, comprising:
    a differential stage formed by a pair of PNP transistors having base terminals supplied with a voltage input signal, emitter terminals connected to each other through a coupling resistance and further connected to a supply line through a first pair of constant current generators, and collector terminals;
    a pair of NPN transistors having collector terminals connected to said emitter terminals of said PNP transistors, emitter terminals connected to ground and base terminals to said collector terminals of said PNP transistors; and
    a pair of second constant current generators interposed between said base terminals of said NPN transistors and ground, so that a collector-emitter current representing the converter output signal passes through said NPN transistors.

2. A converter according to claim 1, wherein said first and second pairs of current generators are constituted by electric resistances.

3. A converter according to claim 1, having a mirror associated therewith to form a current amplifier, said mirror including a further PNP transistor having an emitter terminal connected to a supply line and a diode interposed between a base terminal of said further PNP transistor and said supply line, said base terminal of said further PNP transistor and a collector terminal of said further PNP transistor being connected to ground through respective further PNP transistors having base terminals connected to the base terminals of said NPN transistors of the converter.

4. A converter according to claim 1, having a linearization circuit associated therewith to form a signal multiplier, said linearization circuit including a further PNP transistor having an emitter terminal connected to a supply line, a diode interposed between a base terminal of said further PNP transistor and said supply line, and a pair of further NPN transistors having collector terminals respectively connected to said base terminal of said further PNP transistor and a collector terminal of said further PNP transistor, emitter terminals connected to ground through a further current generator and base terminals connected to the base terminals of said NPN transistors of the converter.

5. A converter according to claim 4, wherein a further diode is interposed between the emitter terminals of said NPN transistors of the converter and ground.

6. A converter according to claim 4, wherein said base terminals of said further NPN transistors of the linearization circuit are connected to the base terminals of said NPN transistors of the converter through respective PNP transistors having emitter terminals connected to the supply line through additional current generators, collector terminals connected to ground and base terminals connected to the base terminals of said NPN transistors of the converter.

* * * * *